United States Patent
Thevasahayam

(10) Patent No.: US 9,706,620 B2
(45) Date of Patent: Jul. 11, 2017

(54) METHODS AND COMPOSITIONS FOR PRODUCING POLARIZED LIGHT

(71) Applicant: EMPIRE TECHNOLOGY DEVELOPMENT LLC, Wilmington, DE (US)

(72) Inventor: Arockiadoss Thevasahayam, Tamilnadu (IN)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 14/780,996

(22) PCT Filed: Mar. 27, 2014

(86) PCT No.: PCT/IB2014/060217
§ 371 (c)(1),
(2) Date: Sep. 28, 2015

(87) PCT Pub. No.: WO2014/155335
PCT Pub. Date: Oct. 2, 2014

(65) Prior Publication Data
US 2016/0044763 A1    Feb. 11, 2016

(30) Foreign Application Priority Data
Mar. 28, 2013    (IN) ............................ 1397/CHE/2013

(51) Int. Cl.
*H05B 33/14* (2006.01)
*H01J 1/50* (2006.01)
(Continued)

(52) U.S. Cl.
CPC ....... *H05B 33/14* (2013.01); *G02F 1/133528* (2013.01); *H01L 51/444* (2013.01);
(Continued)

(58) Field of Classification Search
CPC ......................... H05B 33/14; G02F 1/133528
(Continued)

(56) References Cited

U.S. PATENT DOCUMENTS 5,717,292 A    2/1998    Jin et al.
6,888,660 B2    5/2005    Bussmann et al.
(Continued)

FOREIGN PATENT DOCUMENTS

CN    1378700 A    11/2002
CN    102047447 A    5/2011
WO    2008057615 A2    5/2008

OTHER PUBLICATIONS

"Diffusion Lens Module Light Enhancer Cap," accessed at http://www.enplas.co.jp/english/wp/wp-content/themes/enplas_en/images/led/lec.pdf, accessed on Sep. 24, 2015, pp. 1-2.
(Continued)

*Primary Examiner* — Daniel D Chang
(74) *Attorney, Agent, or Firm* — Pepper Hamilton LLP

(57) ABSTRACT

Polarized white light emitting devices are provided that have a substrate coated with a film of boron chains embedded in carbon nanotubes. An orientation of magnets adjacent the device polarizes and intensifies the light. Methods of making the devices, and methods of producing polarized white light are also provided.

24 Claims, 12 Drawing Sheets

(51) Int. Cl.

| | |
|---|---|
| H01L 51/44 | (2006.01) |
| G02F 1/1335 | (2006.01) |
| H01L 51/52 | (2006.01) |
| H05B 33/02 | (2006.01) |
| H05B 33/10 | (2006.01) |
| H05B 33/28 | (2006.01) |
| H01L 51/00 | (2006.01) |

(52) U.S. Cl.
CPC ......... *H01L 51/5293* (2013.01); *H05B 33/02* (2013.01); *H05B 33/10* (2013.01); *H05B 33/28* (2013.01); *H01L 51/008* (2013.01); *H01L 51/0037* (2013.01); *H01L 51/0049* (2013.01); *H01L 2251/301* (2013.01); *H01L 2251/305* (2013.01); *H01L 2251/306* (2013.01); *H01L 2251/308* (2013.01); *Y02E 10/549* (2013.01); *Y02P 70/521* (2015.11)

(58) Field of Classification Search
USPC .................. 315/32, 294; 313/506, 582, 584
See application file for complete search history.

(56) References Cited

U.S. PATENT DOCUMENTS

| | | | |
|---|---|---|---|
| 6,914,372 B1 | 7/2005 | Akiyama et al. | |
| 7,227,305 B2* | 6/2007 | Liu | H01L 27/3209 313/504 |
| 7,332,222 B2 | 2/2008 | Luzzi et al. | |
| 7,411,223 B2* | 8/2008 | Liu | H01L 51/0021 257/741 |
| 8,399,900 B2 | 3/2013 | Hartmann | |
| 8,951,645 B2* | 2/2015 | Jeong | H01L 51/0072 257/40 |
| 2002/0180373 A1 | 12/2002 | Park | |
| 2009/0035555 A1 | 2/2009 | Brahim et al. | |
| 2009/0253580 A1 | 10/2009 | Pfefferle et al. | |
| 2010/0289435 A1* | 11/2010 | Kita | C09K 11/0883 315/363 |
| 2011/0007560 A1 | 1/2011 | Dieny et al. | |

OTHER PUBLICATIONS

"FTO Glass Substrate (TEC 70) 100×100×3.2 mm, R:58-72 ohm/sq 25pcs /pack," accessed at https://web.archive.org/web/20110910035919/http://www.mtixtl.com/yszceramicsubstrate10x10x05mmonesidepolished-2-4-1-1-1.aspx, accessed on Sep. 24, 2015, pp. 2.

"Ito Coated Glass, Ito Coated Glass Suppliers and Manufacturers at Alibaba.com," accessed at http://www.alibaba.com/showroom/itocoatedglass.html, accessed on Sep. 24, 2015, pp. 1-8.

Baibarac, M., et al., "Electrochemically Functionalized Carbon Nanotubes and their Application to Rechargeable Lithium Batteries," Small, vol. 2, No. 8-9, pp. 1075-1082 (Aug. 2006).

Borowiak-Palena, E., et al., "Synthesis and electronic properties of B-doped single wall carbon nanotubes," Carbon, vol. 42, Issue 5-6, pp. 1123-1126 (2004).

Chan, L.H., et al., "Role of extrinsic atoms on the morphology and field emission properties of carbon nanotubes," Applied Physics Letters, vol. 82, No. 24, pp. 4334-4336 (Jun. 16, 2003).

Fiederling, R., et al., "Injection and detection of a spin-polarized current in a light-emitting diode," Letters to nature, vol. 402, pp. 787-790 (Dec. 16, 1999).

Gerhardt, N.C., et al., "Ultrafast circular polarization oscillations in spin-polarized verticalcavity surface-emitting laser devices," Proceedings of SPIE—The International Society for Optical Engineering, pp. 1-10 (Feb. 2010).

Handuja, S., et al., "Growth of Nitrogen-Containing Carbon Nanotubes by Thermal Chemical Vapor Deposition," Synthesis and Reactivity in Inorganic, Metal-Organic, and Nano-Metal Chemistry, vol. 37, Issue. 6, pp. 485-487 (2007).

Hsu, W.K., et al., "Boron-doping effects in carbon nanotubes," Journal of Materials Chemistry, vol. 10, Issue 6, pp. 1425-1429 (Apr. 25, 2000).

Hu, S., et al., "Prediction of Formation of Cubic Boron Nitride Nanowires inside Silicon Nanotubes," J. Phys. Chem. C, vol. 114, No. 47, pp. 19941-19945 (Nov. 4, 2010).

International Search Report and Written Opinion for International Application No. PCT/IB2012/056721 mailed May 7, 2013.

International Search Report and Written Opinion for International Application No. PCT/IB2014/060217 mailed Sep. 12, 2014.

Li, Y. and Li, H. "Structures and Electronic, Optical Properties of Hydrogen Nanowires Encapsulated in Single-walled Boron Nitride Nanotubes," Journal of Materials Science & Technology, vol. 26, No. 6, pp. 542-546 (2010).

Ma, T., "Resonant Spin Polarization in a Two-Dimensional Hole Gas," Modern physics Letters B, vol. 25, Issue 15, pp. 1-6 (Oct. 9, 2007).

Manago, T., and Akinaga, H., "SPIN-polarized light emitting diode using metal/insulator/semiconductor structures," applied physics letters, vol. 81, Issue 4, pp. 1-4 (2002).

Matioli, E., et al., "High-brightness polarized light-emitting diodes," Light Science & Applications, pp. 1-7 (Aug. 3, 2012).

Povinelli, M.L., et al., "Toward photonic-crystal metamaterials: Creating magnetic emitters in photonic crystals," applied physics letters, vol. 82, Issue 7, pp. 1069-1071 (Feb. 17, 2003).

Rosolen, J.M., et al., "Electron field emission from composite electrodes of carbon nanotubes-boron-doped diamond and carbon felts," Applied Physics Letters, vol. 88, No. 8, pp. 083116-1-083116-3 (Feb. 23, 2006).

Rubio, A., et al., "Theoretical study of one-dimensional chains of metal atoms in nanotubes," Physical Review B, vol. 53, No. 7, pp. 4023-4026 (Feb. 15, 1996).

Scheeline, A., and Kelley, K., "Cell Phone Spectrophotometer," accessed at http://web.archive.org/web/20150915181645/http://www.asdlib.org/onlineArticles/elabware/Scheeline_Kelly_Spectrophotometer/index.html, accessed on Sep. 19, 2015, p. 1.

Sharma, R.B., et al., "Field emission properties of boron and nitrogen doped carbon nanotubes," Chemical Physics Letters, vol. 428, Issues 1-3, pp. 102-108 (Jul. 1, 2006).

Terrones, M., et al., "Doped Carbon Nanotubes: Synthesis, Characterization and Applications," Carbon Nanotubes, vol. 111, pp. 531-566 (2008).

Williams, Q. L., et al., "Boron-doped carbon nanotube coating for transparent, conducting, flexible photonic devices," Applied Physics Letters, vol. 91, pp. 143116-1-143116-3 (Oct. 3, 2007).

Zettl, A., et al., "Boron Nitride Nanotube Peapods," AIP Conference Proceedings, vol. 633, pp. 140-144 (2002).

Zhao, X., et al., "Carbon Nanowire Made of a Long Linear Carbon Chain Inserted Inside a Multiwalled Carbon Nanotube," Physical Review Letters, vol. 90, No. 18, pp. 187401-1-187401-4 (May 6, 2003).

Diffusing Lens Modules for LED, accessed at http://www.enplas.co.jp/english/business/led_product//, accessed on Dec. 23, 2015, pp. 1-3.

Chen and Tsai, Growth and field emission of carbon nanotubes on gated structured, accessed at http://web.archive.org/web/20040419095138/http://rdweb.adm.nctu.edu.tw/report/upload/2nd/03D042_p.doc, accessed on May 25, 2016, pp. 1-21.

Chen and Tsai, et al., The characterization of boron-doped carbon nanotube arrays, Diamond and Related Materials (Sep. 2003), 12(9) pp. 1500-1504.

Schubert, Student Develops New LED, Wins $30,000 Lemelson-Rensselaer Prize, accessed at http://web.archive.org/web/20130308055341/http://news.rpi.edu/update.do?artcenterkey=2406, Feb. 28, 2008, pp. 1-2.

Sepsi et al., Investigation of polarized light emitting diodes with integrated wire grid polarizer, Optics Express (Jul. 5, 2010), 18(14) pp. 14547-14552.

(56) References Cited

OTHER PUBLICATIONS

Su and Lin, Polarized white light emitting diodes with a nano-wire grid polarizer, Optics Express (Jan. 14, 2013), 21(1) pp. 840-845.
Watanabe et al., A chiral π-stacked vinyl polymer emitting white circularly polarized light, Chemical communications (Sep. 12, 2011), 47(39) pp. 10996-10998.
Extended European Search Report for Patent Application No. 12876127.7, mailed Jul. 28, 2016, pp. 10.
Kang et al., Enhanced Field Emission Behavior from Boron-Doped Double-walled Carbon Nanotubes Synthesized by catalytic Chemical Vapor Deposition, Journal of Magnetics (Mar. 31, 2012), 17(1) pp. 9-12.
Lyu et al., Synthesis of boron-doped double-walled carbon nanotubes by the catalytic decomposition of tetrahydrofuran and triisopropyl borate, Carbon (Apr. 2011), 49(5) pp. 1532-1541.

\* cited by examiner

METHODS AND COMPOSITIONS FOR PRODUCING POLARIZED LIGHT

CROSS-REFERENCE TO RELATED APPLICATIONS

This application is a U.S. national stage filing under 35 U.S.C. 371 of International Application No. PCT/IB2014/060217 entitled "Methods and Compositions for Producing Polarized Light," filed on Mar. 27, 2014, which claims priority from Indian Patent Application Serial No. 1397/CHE/2013, filed Mar. 28, 2013. The contents of each of these applications are incorporated herein by reference in their entireties.

BACKGROUND

Visible light is a form of electromagnetic radiation, with electric and magnetic vectors oscillating perpendicular to the direction of propagation, and generally in any direction perpendicular to the direction of propagation. Polarization of the light restricts the oscillations into only a few directions. Polarizers, such as polarizing filters, absorb or block incident light oscillating in all but one plane, yielding planar polarization. Polarization of a light source therefore also reduces the intensity of the source theoretically by 50%, but in practice closer to 60-65%.

Liquid crystal displays (LCDs), the predominant technology currently used in most displays, rely on polarized light. Liquid crystal displays work by sandwiching a layer of liquid crystal molecules between two transparent electrodes and two polarizing filters. A combination of a backlight and control of the voltage applied to each pixel of the display allows light to escape and create images we see as the viewer. The use of the polarizing filters therefore results in an increased thickness of the display, as well as a reduction in the intensity of the light which emerges from the display.

Therefore, there remains a need for providing polarized light with the use of fewer components while also increasing the intensity of the light.

SUMMARY

The devices and methods for making and using the devices described herein fulfill these needs and others. Electroluminescent compositions comprising a boron chain embedded carbon nanotube are provided, in which the light emitted from the compositions may be intensified and polarized by the placement of at least one magnet adjacent the light source.

In an embodiment, a light emitting device includes a first transparent conducting substrate, a second transparent conducting substrate spaced apart from the first transparent conducting substrate and coated with a film comprising a boron chain embedded in a carbon nanotube, a power source operably connected to each of the first and second substrate plates, and at least one magnet positioned in close proximity to the film.

In an embodiment, a method of producing polarized light from a light emitting device includes applying an electrical current to a light emitting device that includes a first transparent conducting substrate plate, a second transparent conducting substrate plate coated with a film comprising a boron chain embedded in a carbon nanotube, and at least one magnet positioned in close proximity to the film. The film has an upper surface, a bottom surface, and an edge, and a power source is operably connected to the first and second substrate plates to apply electrical current across the first and second substrate plates.

In an embodiment, a method of making a light-emitting device includes providing a first transparent conducting substrate with a film comprising a boron chain embedded in a carbon nanotube, the film comprising an upper surface, a bottom surface, and an edge, disposing the first transparent conducting substrate adjacent a second transparent conducting substrate with the film towards the second transparent conducting substrate, positioning a magnet in close proximity to the film, and configuring the first and second transparent conducting substrates for connection to a power source.

DETAILED DESCRIPTION

Figure 1:
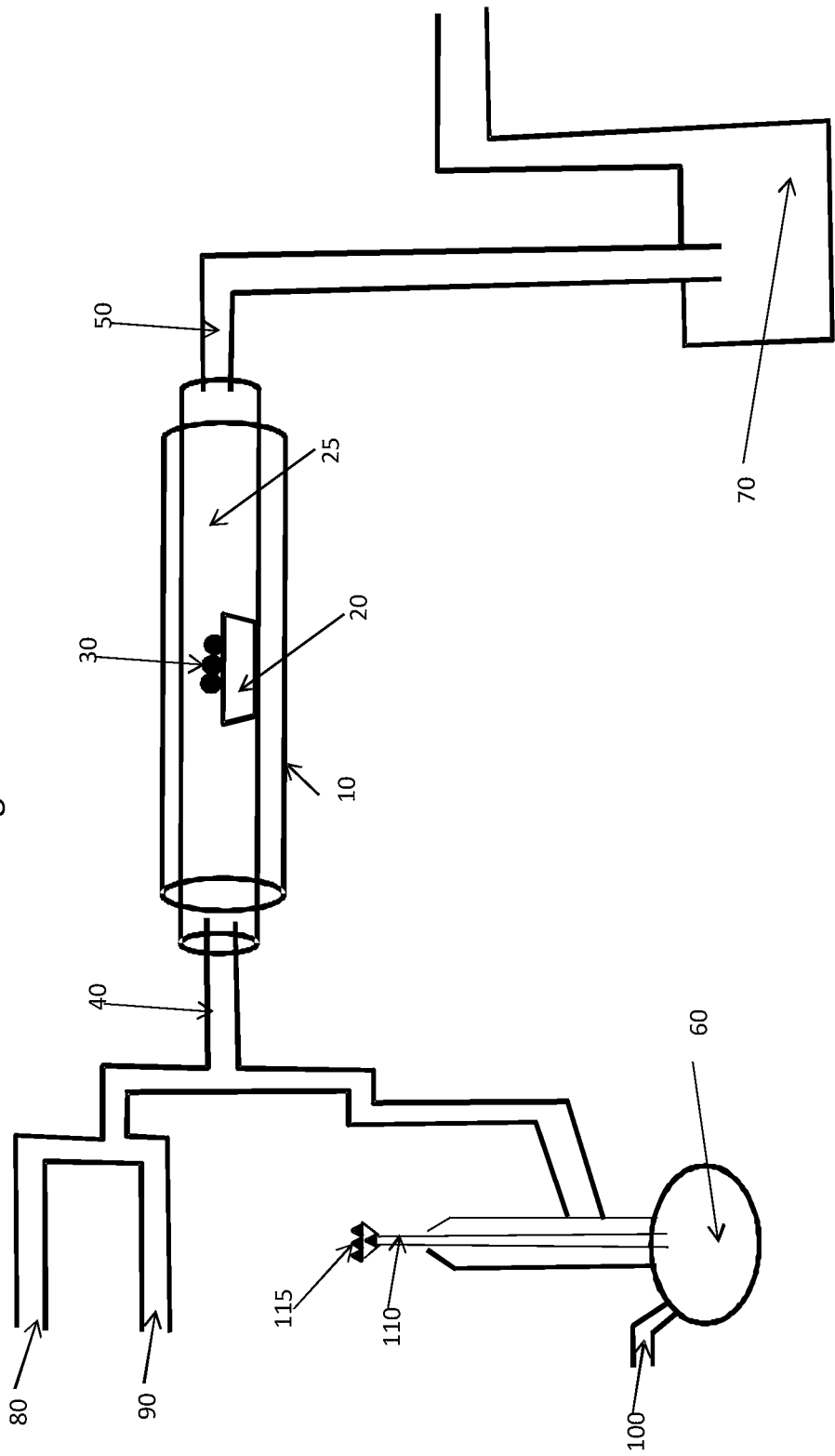
FIG. 1 illustrates a non-limiting example of a system for creating a boron embedded carbon nanotube.

Embodiments described herein provide compositions or compounds comprising an antiferromagnetic material of boron chains embedded in carbon nanotubes. The resistance of the boron chain embedded carbon nanotubes was measured using a four point probe and determined to be greater than about 1 megaohm. In embodiments, the composition is an electroluminescent composition capable of producing a white light emission. In additional embodiments, when the antiferromagnetic material is exposed to a magnetic field, the emitted light is at least partially polarized and exhibits an increased intensity over the intensity that is produced when the magnetic field is not present.

As used herein, the term "electroluminescent composition" refers to a composition that generates light when electricity is applied to the composition. In some embodiments, the light is white light. In some embodiments, the light is essentially pure white light. In some embodiments, the light is pure white light. In some embodiments, the boron embedded carbon nanotube generates pure white light or essentially pure white light when an electrical field is applied to the carbon nanotube. In some embodiments, the boron embedded carbon nanotube generates a light other than pure white light. The color of the light can be modified by, for example, doping the carbon nanotube with multivalent transition metal nanoparticles. Examples of transition metal nanoparticles, include, but are not limited to, platinum, palladium, gold, silver, vanadium, and the like. The nanotube can be doped with one or a combination of different transition metal nanoparticles. The carbon nanotube can also be doped with, for example, nitrogen, oxygen, halogens, or a combination thereof. The doping of the nanotube will change the wavelength of the light, therefore, allowing the color to be modified.

In some embodiments, the carbon nanotube is coated onto a conducting oxide. In some embodiments, the conducting oxide is a transparent conducting oxide. In some embodiments, the transparent conducting oxide is about 10%, 20%, 30%, 40%, 50%, 60%, 70%, 80%, 90%, 95%, or 100% transparent to light passing through the material. In some embodiments, the transparent conducting oxide is at least 50%, 60%, 70%, 80%, 90%, or 95% transparent. In some embodiments, the transparent conducting oxide is at least 80% transparent.

In some embodiments the conducting oxide has a conductivity of about 1 ohm to about 50 ohms. In some embodiments, the conducting oxide has a conductive of about 5 ohms to about 50 ohms, about 10 ohms to about 50 ohms, about 20 ohms to about 50 ohms, about 30 ohms to about 50 ohms, or about 40 ohms to about 50 ohms. Specific examples of conductivity include about 5 ohms, about 10 ohms, about 20 ohms, about 30 ohms, about 40 ohms, about 50 ohms, and ranges between any two of these values. In some embodiments, the conductivity is lower than 50 ohms.

Examples of a conductive oxide include, but are not limited to fluorine-tin-oxide (FTO), indium-tin-oxide (ITO), aluminum-zinc-oxide (AZO) and the like. In some embodiments, the nanotube is coated onto a conducting oxide glass plate. In some embodiments, the glass plate is a FTO or ITO glass plate. In some embodiments, the composition comprises any combination of the conducting oxide plates, such as, for example an FTO glass plate and an ITO glass plate.

In some embodiments, the carbon nanotube is coated onto a polymer, or plastic, which may or may not be flexible, to make, for example, a flexible illuminating display. One such type of polymer may include poly(3,4-ethylenedioxythiophene) poly(styrenesulfonate) (PEDOT:PSS). In some embodiments, the carbon nanotube is coated onto a grapheme substrate. The compositions described herein, can be used for general lighting, displays, such as LCDs, or backlighting objects, such as displays.

In some embodiments, the conducting substrates (e.g., an ITO glass plate(s) and/or FTO glass plate(s)) are separated by a gap. In some embodiments, the gap is about 0.1 mm to about 0.2 mm. In some embodiments, the gap is about 0.15 mm to about 0.2 mm. In some embodiments, the gap is about 0.18 mm to about 0.2 mm. In some embodiments, the gap is about 0.18 mm. Specific examples of the gap include about 0.10 mm, about 0.11 mm, about 0.12 mm, about 0.13 mm, about 0.14 mm, about 0.15 mm, about 0.16 mm, about 0.17 mm, about 0.18 mm, about 0.19 mm, about 0.20 mm, and ranges between any two of these values. In some embodiments, the gap is a sufficient distance such that the intensity of the light being emitted is maximized. As the gap is increased, the intensity of the light emitted by the carbon nanotube will decrease. Therefore, in some embodiments, the intensity of the light is modulated by increasing or decreasing the gap between the substrate plates.

In some embodiments, a configuration of magnets may be placed in proximity to the substrate plates so that the magnets are adjacent, but spaced apart from the film of boron chain embedded carbon nanotubes. The magnets may be spaced apart from the film by a distance from greater than 0 mm to about 5 mm. Specific examples of the spacing may include about 0.1 mm, about 0.2 mm, about 0.3 mm, about 0.4 mm, about 0.5 mm, about 0.6 mm, about 0.7 mm, about 0.8 mm, about 0.9 mm, about 1.0 mm, about 1.2 mm, about 1.4 mm, about 1.6 mm, about 1.8 mm, about 2.0 mm, about 2.2 mm, about 2.4 mm, about 2.6 mm, about 2.8 mm, about 3.0 mm, about 3.2 mm, about 3.4 mm, about 3.6 mm, about 3.8 mm, about 4.0 mm, about 4.2 mm, about 4.4 mm, about 4.6 mm, about 4.8 mm, about 5.0 mm, and ranges between any two of these values. In some embodiments, the spacing is a sufficient distance such that the polarization of the light and/or the intensity of the light being emitted is maximized. Therefore, in some embodiments, the degree of polarization and/or the intensity of the light is modulated by increasing or decreasing the gap between the substrate plates.

In some embodiments, the magnets may provide a magnetic field strength of about 0.1 tesla to about 0.2 tesla (about 1000 gauss to about 2000 gauss) in the vicinity of the film. Specific examples of the strength of the magnetic field may include about 0.1 tesla, about 0.11 tesla, about 0.12 tesla, about 0.13 tesla, about 0.14 tesla, about 0.15 tesla, about 0.16 tesla, about 0.17 tesla, about 0.18 tesla, about 0.19 tesla, about 2.0 tesla, and ranges between any two of these values. For example, in one embodiment, the magnetic field strength may be about 0.139 tesla (1390 gauss).

Embodiments described herein provide methods of preparing a boron chain embedded carbon nanotube. In some embodiments, the method comprises contacting at least one hydrocarbon gas and at least one boron gas in a furnace. In some embodiments, the boron gas is $B_3N_3H_6$. In some embodiments, the boron gas is $B_2O_3$ or $BCl_3$. The conditions described herein can be modified according the specific type of boron gas that is used. In some embodiments, the hydrocarbon gas is acetylene gas. In some embodiments, the hydrocarbon gas is methane. In some embodiments, the boron gas and the hydrocarbon gas are contacted with the furnace sequentially. In some embodiments, the boron gas and the hydrocarbon gas are contacted with the furnace concurrently (for example, simultaneously).

As used herein, the term "furnace" refers to a device, structure, or apparatus where a reaction can take place, and, for example, the temperature can be modulated. The exact structure of the furnace can be modified to conform to the system and for the product being generated.

In some embodiments, the furnace comprises at least one metal catalyst. The catalyst may facilitate the generation of the boron embedded carbon nanotube when the hydrocarbon gas is contacted with the boron gas in the presence of the metal catalyst. In some embodiments, the metal catalyst is mischmetal-nickel ($MmNi_6$), $MmNi_3$, nickel (Ni), ruthenium (Ru), platinum (Pt), palladium (Pd), mischmetal (Mm), or any combinations thereof. As used herein, the term "mischmetal" refers to an alloy of rare earth elements. In some embodiments, the catalyst is encapsulated or placed on a quartz substrate, such as, but not limited to, a quartz tube or quartz platform. In some embodiments, a quartz platform is placed in a quartz tube. The quartz tube can also be inside a furnace.

The temperature of the reaction may be varied depending upon the hydrocarbon gas that is used. The specific temperature can, therefore, be modified depending upon the specific hydrocarbon gas that is used to generate the boron embedded carbon nanotube. In some embodiments, the temperature is at least about 1100° C. In some embodiments, the temperature is about 1000° C. to about 1100° C., about 1025° C. to about 1100° C., about 1150° C. to about 1100° C., or about 1175° C. to about 1100° C. In some embodiments, the temperature is about 650° C. to about 800° C., about 675° C. to about 775° C., or about 700° C. to about 750° C. In some embodiments, the temperature is about 1050° C. to about 1100° C. when acetylene gas is used. In some embodiments, the temperature is about 700° C. to about 750° C. when methane gas is used. In some embodiments, the temperature is about 550° C., 600° C., 650° C., 700° C., 750° C., 800° C., 850° C., 900° C., 950° C., 1000° C., 1050° C., or about 1100° C.

The pressure of the reaction can be also optionally be modified in order to control the reaction. In some embodiments, the pressure is about 5 bar, 6 bar, 7 bar, 8 bar, 9 bar, or 10 bar, where 1 bar is equal to 100 kPa. The exact pressure used will depend upon the size of the furnace, but the pressure can be modified so that the pressure is sufficient for the preparation of the boron embedded carbon nanotubes.

In some embodiments, the furnace is heated to a temperature of about 500° C. to about 600° C., about 540° C. to about 560° C., or about 550° C. prior to contacting the hydrocarbon gas with the catalyst. In some embodiments, the temperature is increased to about 1000° C. to about 1200° C., about 1000° C. to about 1150° C., about 1050° C. to about 1150° C., or about 1100° C. The temperature of the catalyst in the furnace can be increased, for example, at a rate of about 1, 2, 3, 4, 5, 6, 7, 8, 9, or 10° C. per minute.

In some embodiments, hydrogen gas is passed through the furnace during the reaction of making the boron embedded carbon nanotube. In some embodiments, the hydrogen is continuously passed through the furnace. In some embodiments, the gas is passed through the furnace at a pressure of about 1 bar, 2 bar, 3 bar, 4 bar, or 5 bar. The pressure that is used will be determined by the size of the furnace and can be modulated (e.g. increased or decreased) as appropriate for the conditions and the size of the furnace.

In some embodiments, the method comprises generating the boron gas. In some embodiments, the method comprises contacting a boron salt and a reducing agent in the presence of an inert gas under conditions sufficient to produce a boron gas. Examples of a boron salt include, but are not limited to, sodium borohydride, boron trifluoride, diethyl etherate boronic acid, boron nitrate, and the like. Examples of reducing agents, include, but are not limited to, ammonium sulfate, potassium permanganate, hydrazine, hydrogen peroxide, and the like. Any inert gas can be used in creating the boron gas. Examples of inert gases include, but are not limited to, argon gas, helium gas, neon gas, krypton gas, xenon gas, radon gas, nitrogen gas, and the like. In some embodiments, the method comprises contacting sodium borohydride and ammonium sulfate in the presence of argon.

In some embodiments, the method of generating a boron gas comprises contacting the boron salt and the reducing agent, in a container comprising a high boiling point electronegative non-volatile electrolyte and iodide. In some embodiments, the iodide is $I_2$ or tri-iodide. In some embodiments, the electronegative non-volatile electrolyte is tetraglyme, $B_2O_3$, $BF_3$, $BCl_3$, $BBr_3$, $BI_3$, or any combination thereof.

Figure 2:
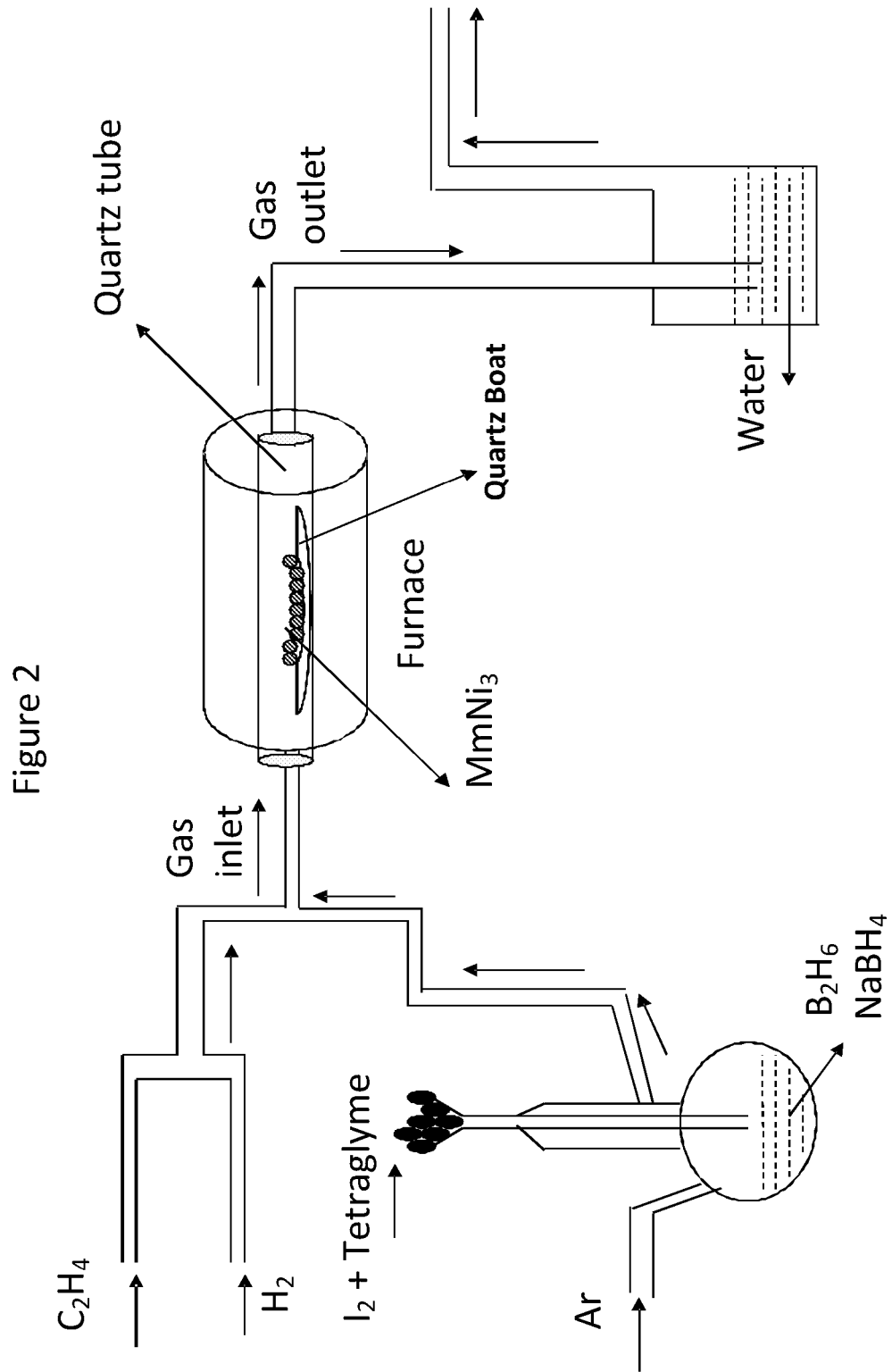
FIG. 2 illustrates a non-limiting example of a system for creating a boron embedded carbon nanotube.

FIGS. 1 and 2 each illustrate a non-limiting example of a system that can be used to make boron chain embedded carbon nanotubes. FIG. 1 illustrates a furnace 10 with a quartz substrate 20 inside of a quartz tube 25. FIG. 1, illustrates a metal catalyst 30 present on the quartz substrate 20. FIG. 1 also illustrates the furnace connected to a gas inlet 40 and a gas outlet 50. FIG. 1 also illustrates a system with a boron gas generator 60. The boron gas generator can, for example, be connected to the furnace through the gas inlet 40. FIG. 1 also illustrates a system comprising a water bath 70 that is used to facilitate the flow of gases through the system. FIG. 1 also illustrates a system comprising a port 80 for the introduction of a hydrocarbon gas and a port 90 for the introduction of hydrogen gas. FIG. 1 also illustrates a port 100 for the introduction of an inert gas into the boron gas generator and a port 110 for the introduction of an electronegative non-volatile electrolyte 115. The system illustrated in FIG. 1 is only one example and many other types of systems can be used to make boron chain embedded carbon nanotubes. FIG. 2 provides more specifics with regard to a system of FIG. 1, and is discussed further below with reference to Example 5.

In some embodiments, the boron chain embedded carbon nanotube is affixed to a substrate plate, such as, for example a fluorine-tin-oxide (FTO) glass plate. Therefore, in some embodiments, a method of affixing a boron chain embedded carbon nanotube onto an FTO glass plate is provided. In some embodiments, the method comprises dispersing the boron chain embedded carbon nanotube in a solvent; coating an FTO glass plate with the dispersed boron chain embedded carbon nanotube; and evaporating the solvent to yield boron chain embedded carbon nanotube coated FTO glass plate. In some embodiments, the solvent is an alcohol or an alkyl alcohol. In some embodiments, the solvent is ethanol, methanol, isobutanol, isopropanol, dimethylformamide, toluene, benzene, carbon tetrachloride, or combinations thereof.

The nanotubes can optionally be dispersed in the solvent so that the nanotubes can be uniformly coated/deposited onto the glass plate. In some embodiments, the nanotube is dispersed in the solvent by sonication. After the solvent containing the nanotube is deposited onto the glass plate, the solvent can be evaporated. The solvent can be evaporated by, for example, heating the plate at a temperature to evaporate the solvent. In some embodiments, the plate is heated to a temperature of at least 100° C. In some embodiments, the plate is heated to a temperature of at about 100° C. to about 120° C. In some embodiments, the plate is heated to a temperature of no more than 120° C. In some embodiments, the plate is baked at a temperature sufficient to remove the solvent. The baking can facilitate the evaporation of the solvent and can be done at any temperature that is sufficient to remove the solvent without damaging the plate or the nanotube, such as temperatures described herein. In some embodiments, the plate is heated, for example, on a hot plate to remove some of the solvent and then baked at a higher temperature to remove all of, or substantially all of, the solvent. In some embodiments, the plate is heated at a temperature of about 200° C. to remove sufficiently all of the solvent.

The nanotube can be coated onto the glass plate. In some embodiments, the nanotube is coated onto the glass plate by spin coating. Any method can be used to uniformly coat the glass plate with the nanotubes.

Figure 3:
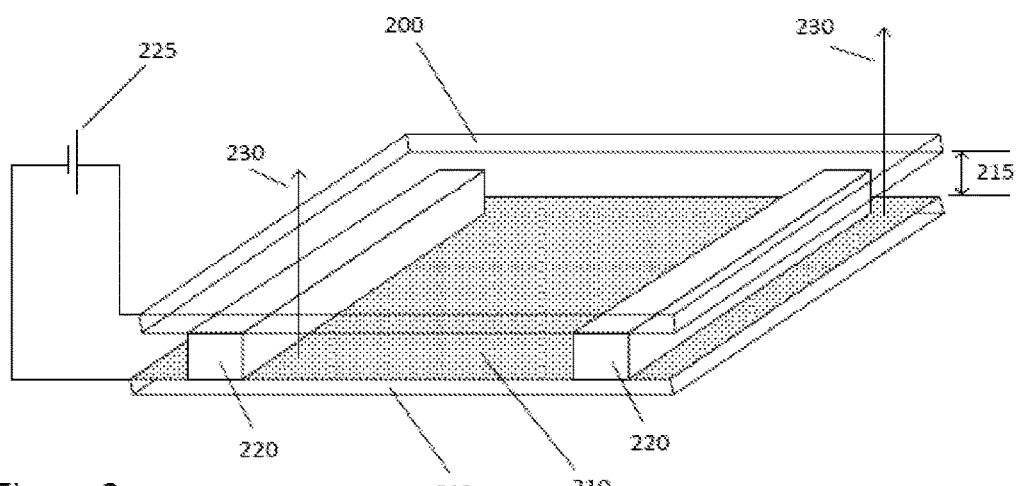
FIG. 3 illustrates a light-emitting device according to an embodiment.

Embodiments of methods of making an electroluminescent composition and an electroluminescent composition are also provided. In some embodiments, as represented in FIG. 3, a first conductive substrate plate 200 may be disposed adjacent a second conductive substrate plate 205 coated with a film 210 of boron chain embedded carbon nanotubes. In one embodiment, the plates may both be of the same conductive substrate, and in other embodiments, the plates may be of different substrates, such as, for example an ITO glass plate and an FTO glass plate. As mentioned previously a gap 215 may be maintained between the face-to-face plates. The gap 215 between the plates may be provided by spaces 220 that may be formed from a non-conductive material. The plates 200 and 205 may be connected with a power source 225 so that a potential difference may be applied to the plates to emit light 230. The gap 215 between the plates 200 and 205 may be adjusted to modulate the intensity of the light 230. Examples of the size of the gap 215 are described above.

Embodiments of methods of generating light are provided. In some embodiments, the method comprises passing electrical current through the adjacent substrate plates 200 and 205. In some embodiments, the method generates pure white light. In some embodiments, the method produces light that has a brightness of about 50 to about 60 lumens. The brightness, however, can also be more than 50 to 60 lumens as well. In some embodiments, the method produces light that has a has a brightness of at least 10 lumens, about 20 lumens, about 30 lumens, about 40 lumens, or about 50 lumens. In some embodiments, the current is at a power of less than about 2.0 W for a 2 cm×2 cm (4 cm$^2$) construct of the composition at a voltage of about 7.0 V (which would be about 0.5 W/cm$^2$). In an embodiment, the current may be about 10 mA at a voltage of about 7.0 V.

Figure 4:
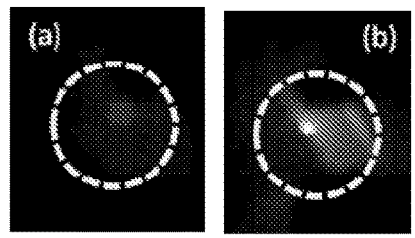
FIGS. 4a and 4b show increase in intensity of emitted light according to an embodiment.
Figure 5:
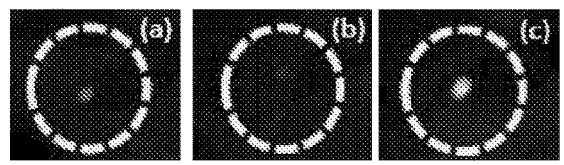
FIGS. 5a-5c illustrate light intensity variations with rotation of a polarizer according to an embodiment.

It has been determined that by placing at least one magnet 300A-300D (see FIGS. 6a-6c) adjacent and spaced apart from the film 210 on plate 205, the light 230 emitted from the device may be at least partially polarized, and intensified. The magnets may be spaced a distance (y) from the film 210. Examples of the size of (y) are described above. In an embodiment, the magnets (300A-300D) may be configured to be the spacers 220 as long as the spacing (y) is provided between the magnets and the film 210 (refer to discussion of FIGS. 7a-7b below). A directional enhancement of up to six to eight fold was observed in the total polarized light emission together with a high polarization degree greater than 90% over a wide spectrum range. In an embodiment wherein the antiferromagnetic film 210 was exposed to a magnetic field of 0.139 tesla (1390 gauss), the light was essentially completely polarized. FIGS. 5a-5c show the intensity of light passing through a polarizer upon rotation of the polarizer through at least about 180 angular degrees, with a power of about 7 V DC, 10 mA current injection. In addition, the intensity of the polarized light was increased by about an order of magnitude. FIGS. 4a and 4b show intensity produced of light produced with and without a magnetic field when supplied with the same power (about 7 V DC, 10 mA current injection). FIG. 4a shows the intensity produced without the magnetic field, and FIG. 4b show the increase in intensity in the presence of the magnetic field. This is in contrast to the current use of polarizing filters which may typically show a decrease in intensity by up to about 65%.

Figure 7A:
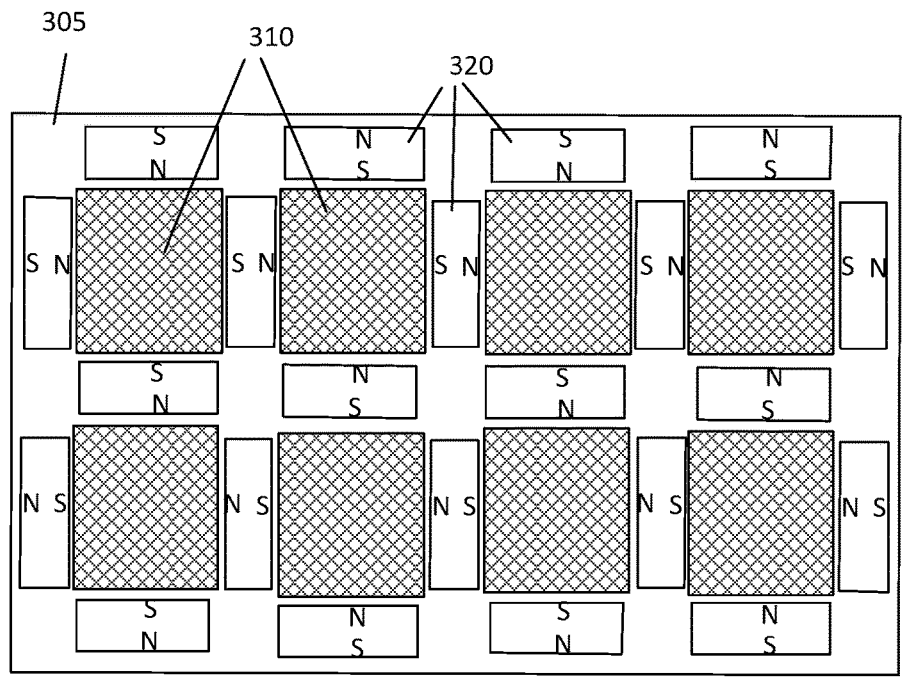
FIGS. 7a and 7b illustrate alternative embodiments of light-emitting sheets.
Figure 7B:
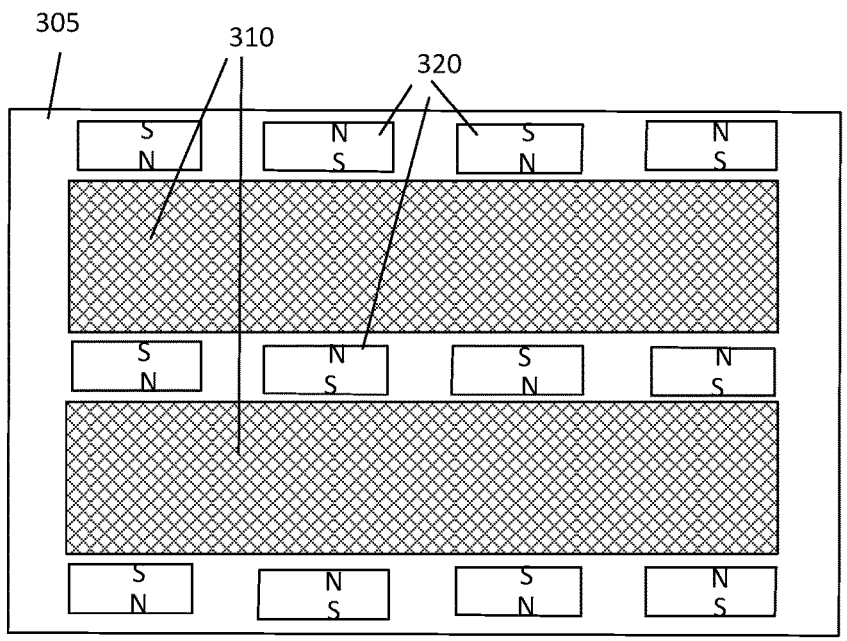

As represented in FIGS. 7A and 7B, larger light emitting sheets may be provided wherein a substrate plate 305 may be coated with delineated areas of film 310. Magnet spacers 320 may be disposed on the plate 305 and spaced apart from the film 310. In an embodiment as shown in FIG. 7A, the magnet spacers 320 may surround the film areas 310 on all sides. Other alternate configurations may also be provided, such as the representation of FIG. 7B.

Additional embodiments include the above-described light emitting devices, further containing a nitrogen chain embedded in the carbon nanotubes. For example, a light emitting device can contain a first transparent conducting substrate, a second transparent conducting substrate spaced apart from the first transparent conducting substrate and coated with a film containing a nitrogen chain embedded in a carbon nanotube, at least one power source operably connected to each of the first and second substrate plates, and at least one magnet positioned in close proximity to the film. The magnet or magnets may be spaced apart from the film by a distance from greater than 0 mm to about 5 mm. Specific examples of the spacing may include about 0.1 mm, about 0.2 mm, about 0.3 mm, about 0.4 mm, about 0.5 mm, about 0.6 mm, about 0.7 mm, about 0.8 mm, about 0.9 mm, about 1.0 mm, about 1.2 mm, about 1.4 mm, about 1.6 mm, about 1.8 mm, about 2.0 mm, about 2.2 mm, about 2.4 mm, about 2.6 mm, about 2.8 mm, about 3.0 mm, about 3.2 mm, about 3.4 mm, about 3.6 mm, about 3.8 mm, about 4.0 mm, about 4.2 mm, about 4.4 mm, about 4.6 mm, about 4.8 mm, about 5.0 mm, and ranges between any two of these values. In some embodiments, the magnets may provide a magnetic field strength of about 0.1 tesla to about 0.2 tesla (about 1000 gauss to about 2000 gauss) in the vicinity of the film. Specific examples of the strength of the magnetic field may include about 0.1 tesla, about 0.11 tesla, about 0.12 tesla, about 0.13 tesla, about 0.14 tesla, about 0.15 tesla, about 0.16 tesla, about 0.17 tesla, about 0.18 tesla, about 0.19 tesla, about 2.0 tesla, and ranges between any two of these values. For example, in one embodiment, the magnetic field strength may be about 0.139 tesla (1390 gauss).

The presence of the nitrogen chain embedded in the carbon nanotube may confer one or more desirable effects or properties. The nitrogen chain may influence the pi-electron cloud of the carbon, providing additional free electron density for charge transport. This in turn may modify the ohmic behavior of the material. The material may have an overlap of conduction bands and valence bands, making it electronically more similar to a metal. As the carbon nanotube is disposed around the nitrogen chain, the overall material may behave more like a conductor than a semiconductor, and may have a low turn-on field value. An increase in luminosity may be observed with an increase in applied voltage due to increasing overlap of the conduction bands and valence bands in the presence of higher strength electric fields. The nitrogen atoms may act as "electron repellants" for the delocalized pi-electrons, making a quasi one-dimensional electron system. As a result, the field strength required for the electrons to be skimming on the surface of the carbon nanotubes is quite low. This conceptual approach may reduce or eliminate any need for the use of high strength electric fields to initiate electron emission from the material.

Embodiments are now described with reference to the following examples. These examples are provided for the purpose of illustration only and the embodiments should in no way be construed as being limited to these examples, but rather should be construed to encompass any and all variations which become evident as a result of the teaching provided herein. Those of skill in the art will readily recognize a variety of non-critical parameters that could be changed or modified to yield essentially similar results.

EXAMPLE 1

Boron Gas Preparation

Boron gas was generated using a 1 liter round bottom three neck flask. The left neck was supplied with Argon gas at 1.5 bar, the middle one is used for dropping 50 mM (millimolar) of tri-iodide in 100 mL tetraglyme solution (a high boiling point electronegative non-volatile electrolyte). This setup allows drop-by-drop of the electrolyte. Boron gas was generated from a composition of 15 g of sodium borohydride (NaBH$_4$) and 13 g of ammonium sulphate [(NH$_4$)$_2$SO$_4$] in the bottom of the flask. The right most neck is used to carry the boron gas into the furnace with the help of Argon gas as the carrier. The reaction was carried out a temperature of 135° C. The reaction to generate the boron gas can be shown as follows:

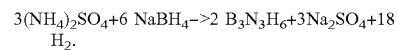

EXAMPLE 2

Boron-Chain Embedded in Carbon Nanotube

FIG. 2 illustrates a non-limiting example of a system for making a boron embedded carbon nanotube. FIG. 2 shows ethylene gas and hydrogen being mixed with boron gas that is generated in the presence of Iodine and tetraglyme and introduced into the furnace. A one-stage tubular muffle furnace of diameter 25.4 mm and length 220 mm was used. Inside the muffle a quartz-tube of inner diameter 14 mm is placed. $MmNi_3$ (5 mg) was placed inside the quartz tube in a quartz boat. The temperature of the muffle furnace was raised to 550° C. at a rate of 5 degrees per minute. Once a steady state temperature of 550° C. was reached, the muffle furnace was passed with hydrogen gas at 2 bar continuously. The temperature of the furnace was then raised to 1100° C. at a rate of 5 degrees per minute. Once a steady state temperature of 1100° C. was reached, the furnace was supplied simultaneously with acetylene gas at 3 bar and boron gas carried by argon gas from the three neck flask described in Example 1. The gases were then allowed to exit from the furnace and through a water bath.

EXAMPLE 3

Spin Coating of Boron Chain Embedded Carbon Nanotube on FTO Coated Plate

About 5 mg of boron chain embedded carbon nanotube was dispersed in 10 ml of ethanol in a bath sonicator for 10 minutes at a power level of 850 watts. The FTO glass plate of 2 cm×2 cm (4 $cm^2$) was placed upon the spin-coating apparatus, cleaned with acetone and then methanol using lint-free swabs, and followed up with iso-propanol, then coated liberally with the above nanotube-ethanol solvent solution by use of eyedropper. The plate was spun at a low speed of 300 rpm for 5 minutes to evenly spread the solution. Once the spin-coating was complete, the plate was placed quickly onto a hot plate (heated to approximately 100° C.) for several seconds to initially evaporate solvent and solidify the coating. The slide was then baked-out for 2-3 hours in a vacuum oven at a temperature of 200° C. to sufficiently remove the remaining solvent. This Example generated a boron embedded carbon nanotube that is coated onto a plate.

EXAMPLE 4

Electroluminescent Sample

An ITO coated glass plate of size 2 cm×2 cm was placed on top of the FTO coated Boron-chain embedded carbon nanotube using spacers such that a gap of 0.18 mm was maintained between the FTO and the ITO electrode surfaces. Current was passed across the electroluminescent sample to generate light including pure white light. The electroluminescent composition was tested in normal atmosphere on a table top for about 4 weeks without any visual loss of brightness. Thus it is expected that the lifetime will be high, low cost and simple process for manufacture without a need for special packaging requirements, which makes this an easily adoptable technology.

The tests were performed on a boron chain inside the carbon nanotube. The FTO (Fluorine Tin oxide) was chosen as the anode and the ITO (Indium tin oxide) was chosen as the cathode. FTO and ITO were chosen because of the transparent conducting electrodes. The ITO electrode was placed at a distance of 0.18 mm from the FTO surface. The anode current is measured as a function of anode-to-cathode voltages. The voltage is varied from 0 V to 15 V DC with an interval of 1 V to study the I-V property characteristics of the boron chain embedded carbon nanotube. The results demonstrated the presence of an ohmic contact between FTO and boron-chain embedded carbon nanotubes, which ohmic contact emits white light and acts as an electroluminescent panel in the presence of low voltage electric field. It was observed that the electroluminescence of the film initiates at a current density of about 2.75 milliamp/$cm^2$ under an electric field of 11 volts/cm. The experiments also surprisingly and unexpectedly revealed that the boron chain embedded carbon nanotube exhibited field emission properties even at low electric fields, unlike other compositions such as boron or nitrogen doped carbon nanotubes that require hundreds of volts, whereas the currently described composition require significantly much less voltage. This result could not have been predicted.

EXAMPLE 5

Polarization with Two Magnets

Figure 6A:
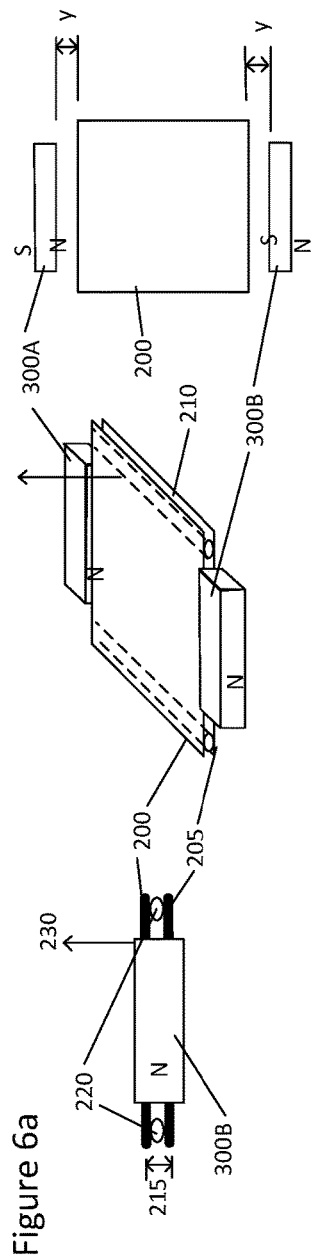
FIGS. 6a-6c illustrate light-emitting devices with magnets according to embodiments.

Using the 2 cm×2 cm plate prepared as in Examples 1-4, bar magnets of 0.139 tesla were placed along the sides as depicted in FIG. 6a, with opposing poles of the magnets directed towards the film. A current injection of 10 mA, 7V DC power was applied to produce an emission of light, and polarization was checked using a polarizing film placed above the sample in the direction of emission. Upon rotation of the polarizing film, the light passing through the film was essentially completely blocked at one angular orientation of the film, while, upon rotation through an additional 90 degrees, essentially full intensity of the light passed through the film.

Figure 8:
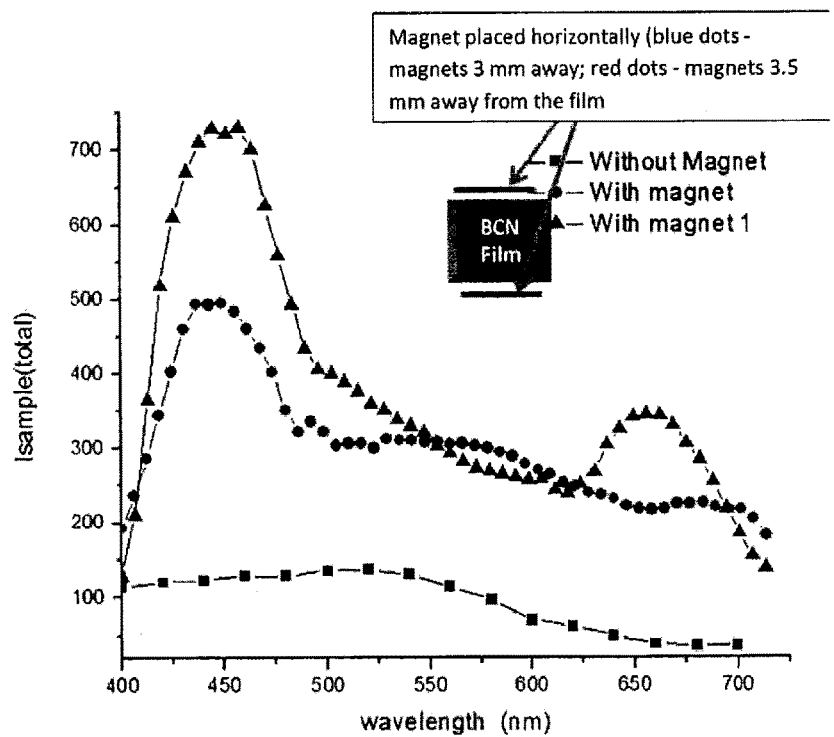
FIGS. 8-12 provide experimental results for embodiments of the light-emitting devices.
Figure 9:
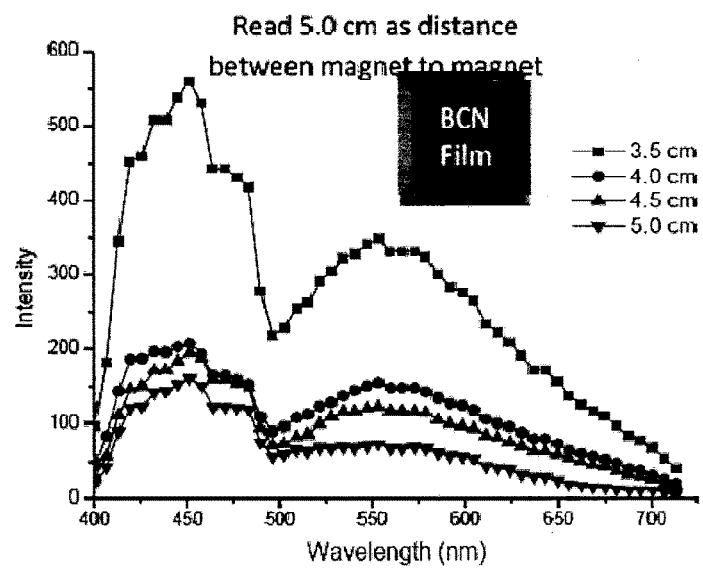

As shown by the results in FIGS. 8 and 9, a further experiment was conducted with and without magnets and with different spacing of the magnets from the film to measure the intensity of the emitted light, with spacing of 3 and 3.5 mm represented in FIG. 8, and spacings of 7.5 mm to 15 mm shown in FIG. 9 (for example, a 4 cm magnet to magnet spacing would have the magnets spaced about 1 cm, or 10 mm from the edges of the plates). As shown, the intensity of the emitted light increased significantly upon placement of the magnets adjacent the plates, and the light intensity differed as a function of the distance of the magnets from the plates.

Figure 6B:
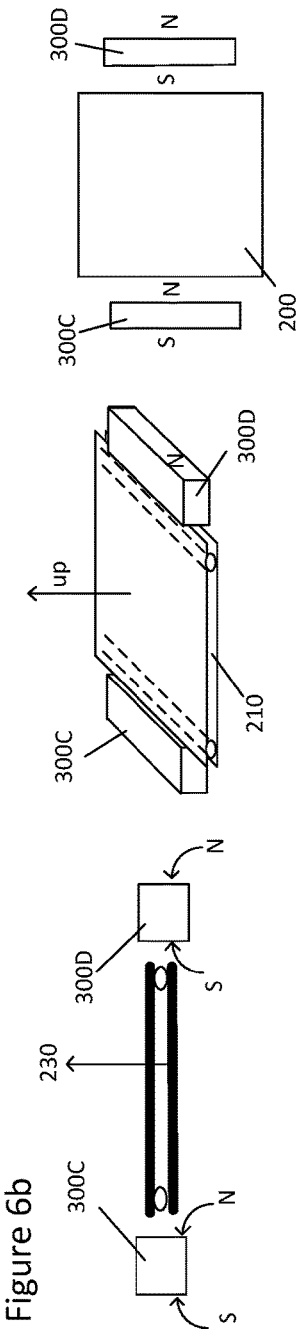
Figure 10:
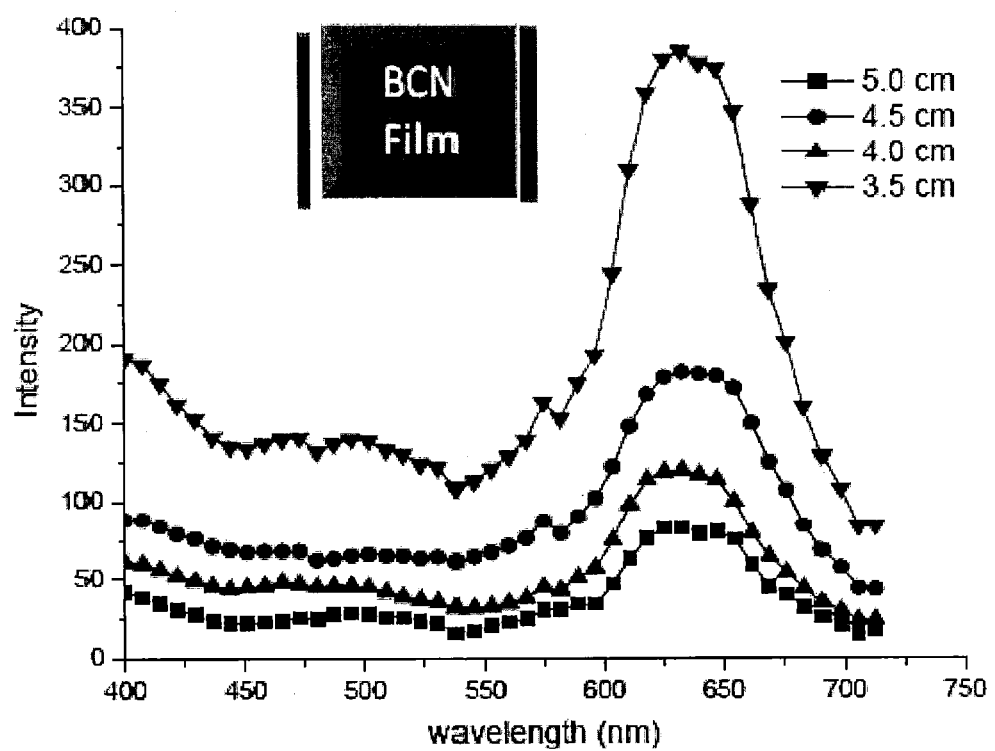

The position of the magnets was then changed to provide a configuration as depicted in FIG. 6b, and light intensity measurements were taken again with alteration in the distance between the magnets. As shown in FIG. 10, similar results were obtained with respect to the intensity as a function of distance, and there was also a shift in the peak wavelengths of the light. As discussed further below, this variation in spatial light intensity due to the orientation of the magnets may possibly be attributed to the antiferromagnetic behavior of the material.

EXAMPLE 6

Polarization with Four Magnets

Figure 6C:
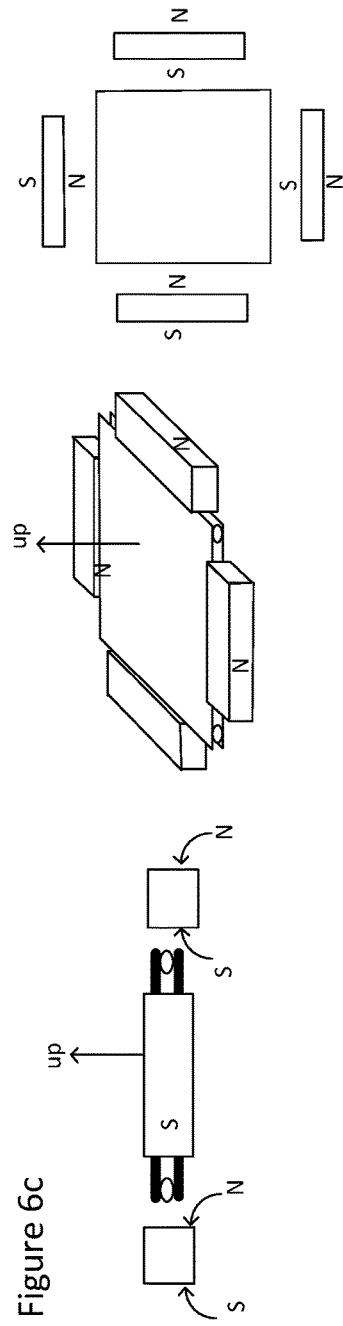
Figure 11:
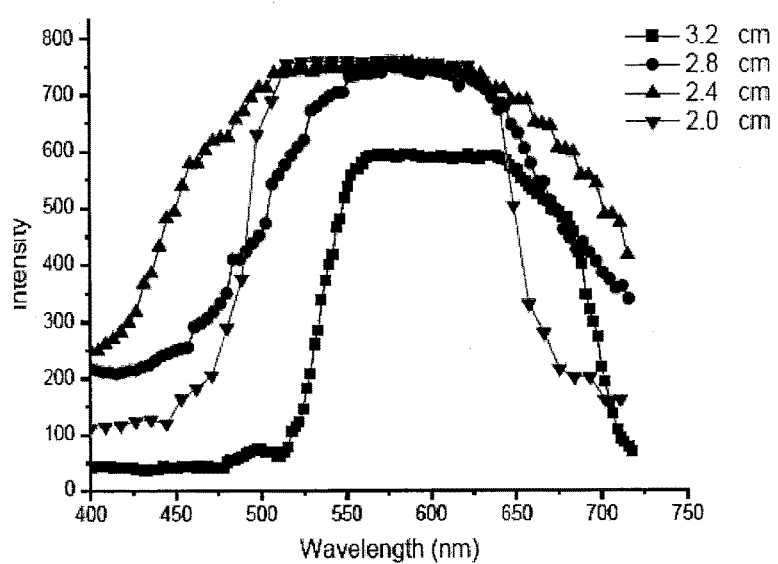

Using the 2 cm×2 cm plates prepared as in Examples 1-4, bar magnets of 0.139 tesla were placed along all four sides as depicted in FIG. 6c, with opposing poles of opposing magnets directed towards the film. A current injection of 10 mA, 7V DC power was applied to produce an emission of light, and the intensity measurements were again taken with the results as depicted in FIG. 11. Similar results were obtained with respect to the intensity as a function of distance, and a shift in the peak wavelengths of the light again occurred. Similarly, this variation in spatial light intensity due to the orientation of the magnets may possibly be attributed to the antiferromagnetic behavior of the material.

Figure 12:
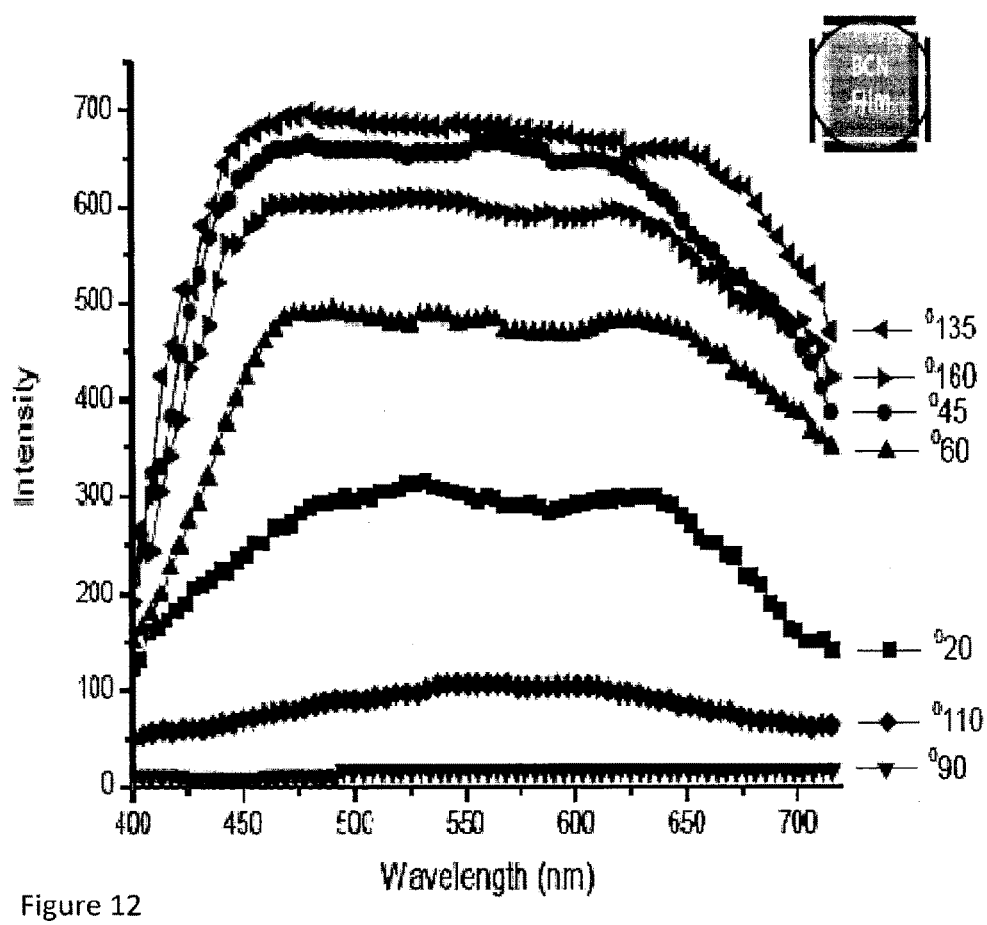

FIG. 12 shows the intensity of the emitted light after passing through a polarizer with rotation of the polarizer through an angular orientation of from about 20 degrees to about 160 degrees.

The influence of the boron chain on the π-electron cloud may provide the requisite free electron density required for charge transport, which is seen in the ohmic behavior of the compositions. This implies that there is an overlap of conduction band and valence band—similar to a metal. Because of the carbon nanotube wrapped around boron, which makes this material behave more as a conductor rather than a semiconductor, the turn on field for this material is low. With a low applied field, the valence band and conduction band begins overlapping. This leads to higher the overlap at higher electric fields. Therefore, an increase in luminosity is observed with an increase in applied voltage. Because of relative loosening of the π-electron cloud away from the honeycomb carbon nanotube the field strength "E" required for the electrons to be tunneled through the annular gap between boron chain and carbon nanotubes is quite low. This approach eliminates the need for high electric field to initiate electron emission from the material. This is an advantage of the compositions and methods described herein as compared to prior compositions.

The incorporation of atoms in the honeycomb lattice of a carbon nanotube with a different number of valence atoms will in general introduce additional states in the density of states (DOS) of the carbon nanotubes. Having only three valence electrons, the boron states will be located below the Fermi-energy of the undoped carbon nanotubes. Due to their reduced valence compared to carbon, the boron atoms can act as electron traps for the delocalized π-electrons i.e., quasi one-dimensional electron system. This quasi one-dimensional electron system confined in a three dimensional host lattice is highly sensitive to the external parameters and, depending on magnetic field, temperature, pressure, electric field, etc., exhibits different properties inherent of 1D, 2D, and 3D systems; the examples are the spin density wave (SDW) state, the Quantum Hall effect, and superconductivity, etc.

The paramagnetic metallic state of the quasi-1D electronic system is unstable, and undergoes a transition to the SDW state, which is an antiferromagnetic (AF) spin-ordered state, or an insulator. (The film used for the study has more than 1 megaohm resistance as measured using four probe method.)

Figure 13:
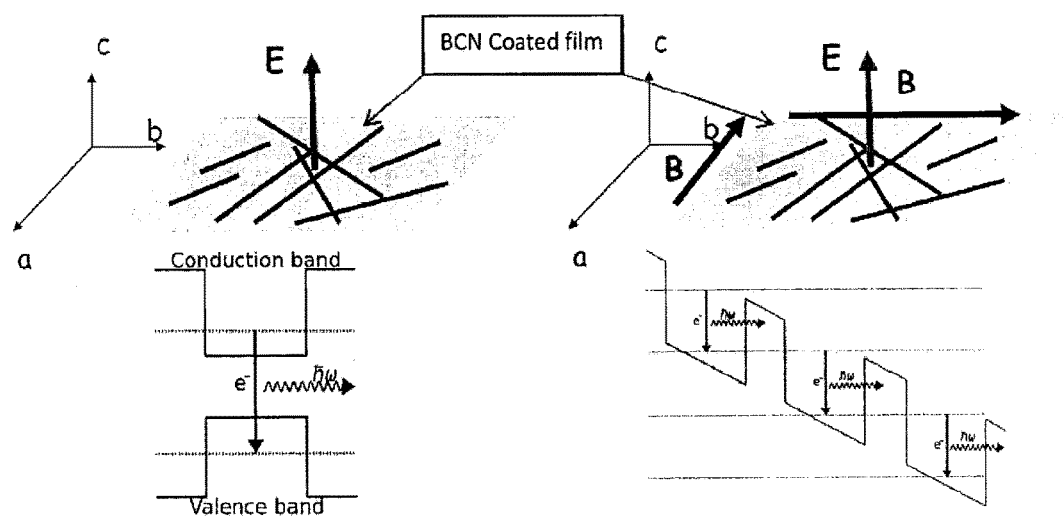
FIGS. 13 and 14 provide representative emission illustrations for possible theoretical explanations of the results.
Figure 14:
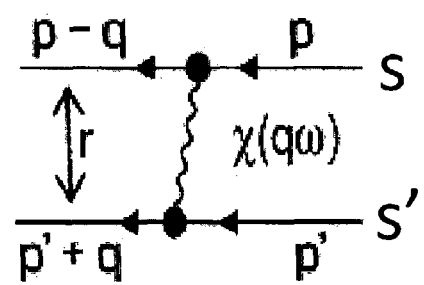

With reference to FIG. 13, exposing the system to only an electric field E (no magnets) may destroy the SDW state and make a paramagnetic metallic state more favorable, resulting in low quantum efficiency and corresponding dim light (no planar confinement, interband transitions emit a single photon). Further exposure to a magnetic field M may cause a cascade of transitions between different Field Induced SDW (FISDW) states, related with magnetic field driven changes (planar confinement leads to multiple energy levels wherein electrons undergo intersub-band transitions and photons are emitted. The lower level of one stage feeds into the upper level of the next, and an electron cascades through the structure, producing as many photons as there are stages, resulting in high quantum efficiency).

The variation in spatial light intensity (shift of the intensity peaks from one wavelength band to another) shown in the experimental results may be attributed to the antiferromagnetic behavior of the material. In a material having two quasiparticles, with spins s and s' (see FIG. 13), the magnetic interaction between the particles may be modified by their coupling to the spin fluctuations characteristic of the background magnetic behavior of the material in which they are located. In general, spin s, located, for example, at the origin, may act to polarize the emission by inducing a spin fluctuation, and this induced magnetization, in turn, couples to the second spin s', located a distance r away, producing an induced effective magnetic interaction. This induced effective magnetic interaction is highly sensitive to the magnetic properties of the material. For an ordinary paramagnet exhibiting weak magnetic behavior, the resulting magnetic interaction between s and s' is quite weak. If, however, the background material is close to being antiferromagnetic, the spectrum of the spin fluctuations that provide the glue connecting the two spins becomes highly momentum dependent. This results in a peak for wave vectors that are close to those for which, one finds a peak in the wave vector dependent magnetic susceptibility. As a result, the induced magnetic quasiparticle interaction will be strong and spatially varying, causing the shift in spectrum peak observed. For this reason, the material has been determined to be antiferromagnetic, and the behavior is magnetic quasi particle in nature. The high resistance of the material (>1 Mega Ohm) corroborates this observation.

In addition to the advantages described herein, the material thus described above is advantageous because it requires low power consumption, such as 70 mW for a 4 $cm^2$ material at 7.0V DC and 10 mA to produce greater than 50-60 lumens. Therefore, the composition can be used to generate light more efficiently and with less power. The lumens can also be improved by aligning the carbon nanotubes. The material is also better because there is no need for high electric field and vacuum for obtaining electroluminescence. Thus, the product can be used in many applications, such as but not limited to, general lighting, displays, backlighting, and others. Other advantages includes that the nanotube could be coated on any transparent conducting substrates such as ITO/FTO or it can be coated onto a plastic substrate to make a flexible illuminating panel. The process to make the electroluminescent composition is low cost and simple process to manufacture.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

This disclosure is not limited to the particular systems, devices and methods described, as these may vary. The terminology used in the description is for the purpose of describing the particular versions or embodiments only, and is not intended to limit the scope.

In the above detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:
1. A light emitting device comprising:
a first transparent conducting substrate;
a second transparent conducting substrate spaced apart from the first transparent conducting substrate and coated with a film comprising a boron chain embedded in a carbon nanotube;
a power source operably connected to each of the first and second substrates; and
at least one magnet positioned in close proximity to the film.

2. The device of claim 1, wherein the first transparent conducting substrate and the second transparent conducting substrate each individually comprise the same or a different one of: indium tin-oxide (ITO), fluorine doped tin oxide (FTO), aluminum zinc oxide (AZO), graphene, and poly(3,4-ethylenedioxythiophene) poly(styrenesulfonate) (PEDOT:PSS).

3. The device of claim 1, wherein the first transparent conducting substrate and the second transparent conducting substrate comprise substrate plates disposed face to face and the device is free of a vacuum sealing between the substrate plates.

4. The device of claim 1, wherein the first transparent conducting substrate and the second transparent conducting substrate comprise substrate plates disposed face to face, and the film on the second transparent conducting substrate is disposed towards the first transparent conducting substrate.

5. The device of claim 4, wherein the substrate plates define an edge and the at least one magnet is positioned adjacent the edge.

6. The device of claim 5, wherein the at least one magnet comprises at least one pair of magnets with each magnet of a pair disposed adjacent opposing edges of the substrate plates.

7. The device of claim 6, wherein the magnets of the pair are disposed with opposing magnetic poles disposed towards the substrate plates.

8. The device of claim 5, wherein the at least one magnet is positioned less than about 5 mm from the edge.

9. The device of claim 1, wherein the first transparent conducting substrate and the second transparent conducting substrate comprise substrate plates separated by at least one spacer.

10. The device of claim 9, wherein the at least one spacer comprises at least one magnet.

11. The device of claim 9, wherein the device is free of a vacuum sealing.

12. The device of claim 1, wherein the power supply is configured to provide power in a range of 2 to 100 mW/cm$^2$.

13. The device of claim 1, wherein:
the first transparent conducting substrate and the second transparent conducting substrate comprise substrate plates disposed face to face, and the film on the second transparent conducting substrate is disposed towards the first transparent conducting substrate;
the substrate plates are rectangular and have two pairs of opposite parallel edges; and
the at least one magnet comprises four magnets, with one magnet disposed adjacent each edge of the substrate plates and spaced from about 0.1 mm to about 5 mm from the edge.

14. The device of claim 13, wherein opposing magnets are disposed with opposing magnetic poles disposed towards the substrate plates.

15. The device of claim 14, wherein the magnets have a magnetic strength of about 0.1 tesla to about 0.2 tesla.

16. The device of claim 15, wherein:
the device is free of phosphors; and
the device is free of a vacuum sealing.

17. A method of producing polarized light from a light emitting device, the method comprising:
applying an electrical current to a light emitting device, wherein the device comprises:
a first transparent conducting substrate plate;
a second transparent conducting substrate plate coated with a film comprising a boron chain embedded in a carbon nanotube, the film comprising an upper surface, a bottom surface, and an edge;
a power source operably connected to the first and second substrate plates to
apply electrical current across the first and second substrate plates; and
at least one magnet positioned in close proximity to the film.

18. The method of claim 17, wherein the first transparent conducting substrate plate and the second transparent conducting substrate plate each individually comprise the same or a different one of: indium tin-oxide (ITO), fluorine doped tin oxide (FTO), aluminum zinc oxide (AZO), graphene, and poly(3,4-ethylenedioxythiophene) poly(styrenesulfonate) (PEDOT:PSS).

19. The method of claim 17, wherein a spacer is positioned between the first transparent conducting substrate plate and the second transparent conducting substrate plate.

20. The method of claim 17, wherein the magnet is positioned less than 5 mm from the edge of the film.

21. The method of claim 17, wherein the power supply provides a power of about 2 to 100 mW/cm$^2$.

22. A method of making a light-emitting device, the method comprising:
applying a film comprising a boron chain embedded in a carbon nanotube to a first transparent conducting substrate, the film comprising an upper surface, a bottom surface, and an edge;
disposing the first transparent conducting substrate adjacent a second transparent conducting substrate with the film towards the second transparent conducting substrate;
positioning a magnet in close proximity to the film; and
configuring the first and second transparent conducting substrates for connection to a power source.

23. The method of claim 22, wherein applying a film further comprises affixing the boron chain embedded carbon nanotube onto the first transparent conducting substrate by a method comprising:
dispersing the boron chain embedded carbon nanotube in a solvent;
coating the first transparent conducting substrate with the dispersed boron chain embedded carbon nanotube; and
evaporating the solvent to yield the film.

24. The method of claim 22, wherein the first transparent conducting substrate and the second transparent conducting substrate each individually comprise the same or a different one of: indium tin-oxide (ITO), fluorine doped tin oxide (FTO), aluminum zinc oxide (AZO), graphene, and poly(3,4-ethylenedioxythiophene) poly(styrenesulfonate) (PEDOT:PSS).

* * * * *

UNITED STATES PATENT AND TRADEMARK OFFICE
CERTIFICATE OF CORRECTION

PATENT NO. : 9,706,620 B2
APPLICATION NO. : 14/780996
DATED : July 11, 2017
INVENTOR(S) : Thevasahayam It is certified that error appears in the above-identified patent and that said Letters Patent is hereby corrected as shown below:

In Column 1, Line 8, delete "U.S.C. 371 of" and insert -- U.S.C. § 371 of --, therefor.

Signed and Sealed this
Thirty-first Day of October, 2017

Joseph Matal
*Performing the Functions and Duties of the
Under Secretary of Commerce for Intellectual Property and
Director of the United States Patent and Trademark Office*